United States Patent [19]

Koppensteiner et al.

[11] 4,403,408
[45] Sep. 13, 1983

[54] PRINTED CIRCUIT CARD EXTRACTING TOOL

[75] Inventors: James V. Koppensteiner, Chicago; Joseph B. Onesto, Oak Lawn, both of Ill.

[73] Assignee: GTE Automatic Electric Labs Inc., Northlake, Ill.

[21] Appl. No.: 274,902

[22] Filed: Jun. 18, 1981

[51] Int. Cl.³ .............................................. H05K 3/36
[52] U.S. Cl. ....................................... 29/764; 29/278
[58] Field of Search ................. 29/764, 762, 747, 758, 29/267, 268, 278; 294/15

[56] References Cited

U.S. PATENT DOCUMENTS

| | | | |
|---|---|---|---|
| 3,617,083 | 11/1971 | Koppensteiner et al. | 294/15 |
| 4,074,411 | 2/1978 | Willard et al. | 29/267 |
| 4,223,934 | 9/1980 | Canceglin et al. | 29/764 X |

*Primary Examiner*—Carl E. Hall
*Attorney, Agent, or Firm*—Anthony Miologos; Robert J. Black

[57] ABSTRACT

A tool for extracting a printed circuit card from a holder the latter having top and bottom guide tracks and a rear wall having contacts engageable by terminal tabs on the card, comprised of a long tubular shaft having a mounting body rotatably connected on one end and a linkage assembly pivotally mounted on opposite end. The mounting body includes a pair of magnets and a retainer clip disposed to mount on the top guide track and a pair of spring guides mounted below the magnets which stradle the circuit card to be extracted. The linkage includes a notched area arranged to interlockingly engage a similar notch on a circuit card stiffener or handle. A pulling force applied to the shaft extracts the card from the holder and its associated contacts.

4 Claims, 3 Drawing Figures

PRINTED CIRCUIT CARD EXTRACTING TOOL

CROSS-REFERENCE TO RELATED APPLICATIONS

This application is related to Applicants' co-pending United States Patent Application, titled "Circuit Card Extractor," Ser. No. 275,085, filed June 18, 1981, and having a common assignee.

BACKGROUND OF THE INVENTION

1. Field of the Invention

The present invention relates to a tool designed to facilitate the extraction of a printed circuit card from a holder.

2. Description of the Prior Art

Today, printed circuit cards are frequently assembled in a holder rack having the shape of an open topped box whose side walls form tracks for the guidance of cards sent to and out of their assembled position. Etched terminal tabs on a base strip or block of each board fit into a socket having co-acting contacts to complete a connection to an external backplane circuit. In practice, the track forming side walls may be horizontally disposed, with the contact bearing sockets arranged on the upright rear wall.

The extraction of such printed circuit cards from their holder is a somewhat delicate operation since the abrupt reduction of frictional resistance upon disengagement of the connectors may lead to an accelerated withdrawal motion deviating from the straight linearity and thus impose bending stresses which could damage the printed circuits. This problem is perceptively increased as the printed circuit boards become larger which substantially increase the extraction force required.

Accordingly, a tool is usually required to properly extract these boards. The tool must be compact, simple to operate as well as human engineered to be comfortably operated by either hand. Many cards presently on the market have extraction mechanisms built on the printed circuit cards. This approach increases the individual card cost and therefore a separate tool is a more economical approach to the card removal requirement.

It therefore becomes an object of the present invention to provide an improved tool of the character described which facilitates the extraction of such printed circuit cards.

SUMMARY OF THE INVENTION

The tool according to our invention has been designed to work with holders of the type having an open card cage construction. The holders should have at least top and bottom front card guides oriented in a horizontal direction. The card guides also include transverse slots which accept lateral edges of a printed circuit card. The slots hold and guide the card to the connector found in the rear of the holder. The invention has also been designed to be used with cards which include either stiffeners or handles on the front edge of the cards.

The tool is comprised of a long tubular shaft having a mounting body rotatably connected on one end and a linkage assembly pivotally mounted on an opposite end. The mounting body includes a pair of magnets, a pair of guides extending outward of the body underneath the magnets and a retainer clip extending outward of the body above the magnets. Finally the linkage includes a notched out area which is disposed to interlockingly engage the card stiffener or handle.

To use our invention to advantage the upper body is mounted to the upper card guide by simply attaching the magnets to the card guide with the spring clips stradling the circuit card. The retainer clip hooks over the top of the upper card guide. With the mounting body installed the linkage is engaged by locking the linkages notched portion to a similar notch in the card handle or stiffener. The handle is grasped and then pulled backwards extracting the card.

DESCRIPTION OF THE DRAWINGS

The above and other features of our invention will now be described in detail with reference to the accompanying drawings in which.

DESCRIPTION OF THE PREFERRED EMBODIMENT

Figure 1:
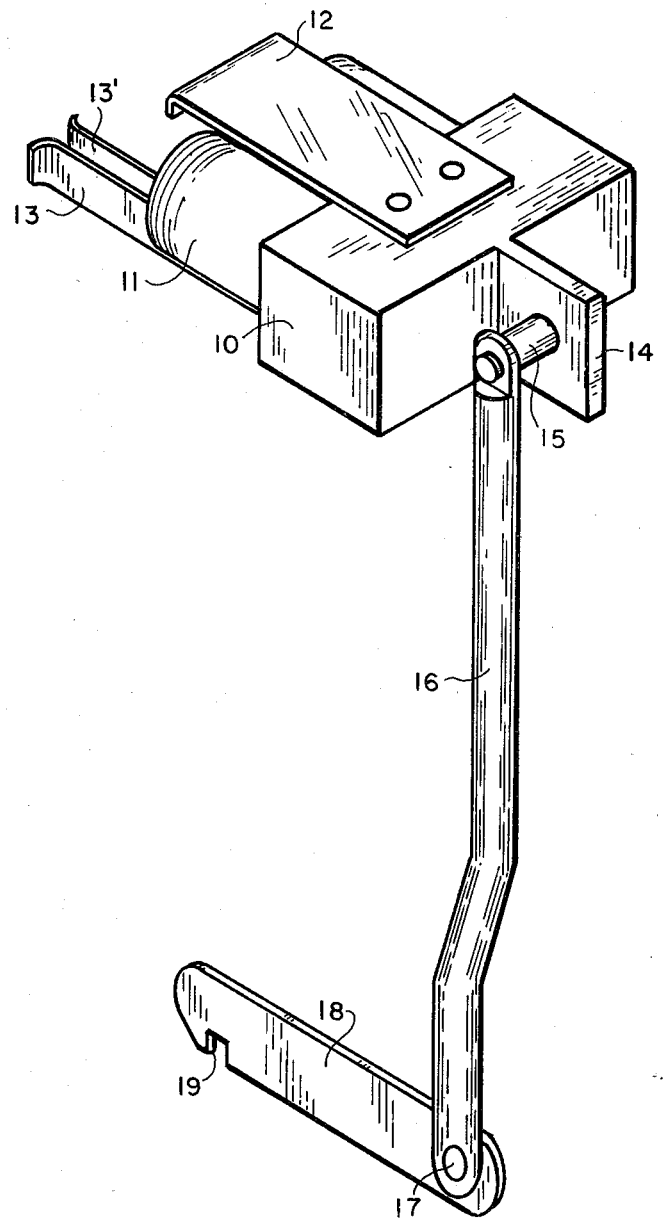
FIG. 1 is a perspective view of the device of the present invention.

Turning now to FIG. 1 the tool of the present invention comprises a tubular handle 16 having an upper mounting body 10 connected via flange 14 and pin 15 on one end and a linkage 18 mounted via pin 17, an opposite end. Upper mounting body 10 further includes a pair of cylindrical magnets 11 (one shown partially) mounted on a front face of body 10 and a pair of spring guides 13, 13' extending outward from the front face parallel and just below the magnets. A retainer clip 12 also extends outward from a top face of body 10. Linkage 18 includes a notched out portion 19 adapted to interlockingly engage the card handle or stiffener of the card to be extracted.

Figure 2:
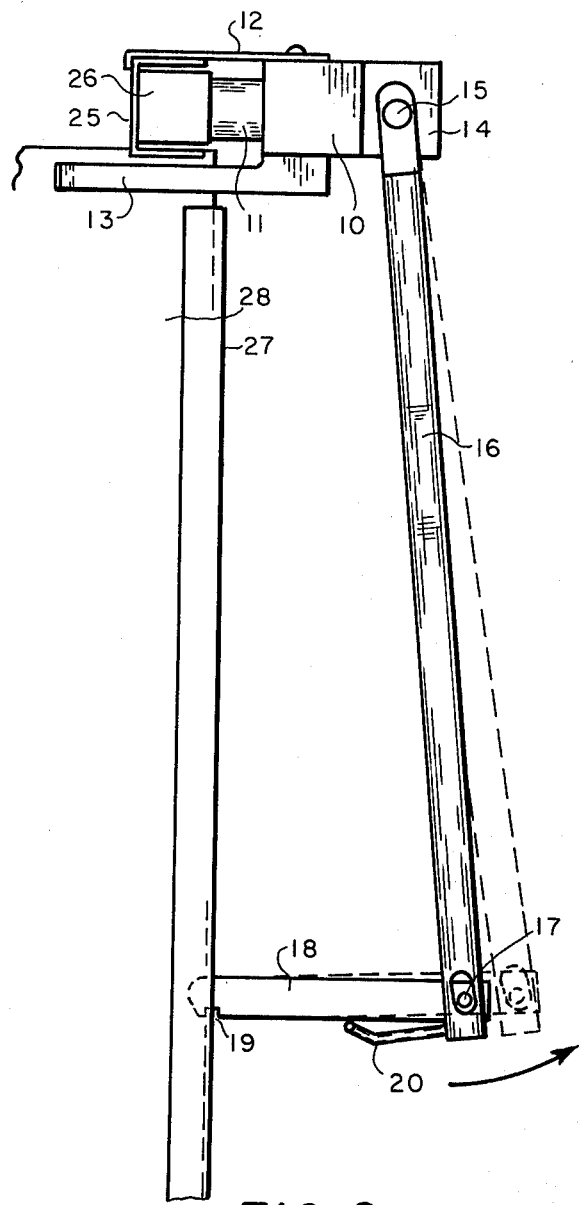
FIG. 2 is a side elevation thereof installed on a partial representation of a card guide and circuit card.

Turning now to FIG. 2, the tool is intended to be used with card holders of the type having a horizontal member or card guide 26 and some means of laterally supporting the card such as bifurcated arms shown as 25, which forms a part of card guide 26. The arms in conjunction with a similar bottom guide and arm (not shown) hold card 28 in a verticle position. The card assembly is completed by a handle or stiffener bracket 27 attached to the front edge of card 28. It should be noted at this time that the card is connected to either a single or a double connector on an edge opposite the card handle. These items are not shown for clarity and are well known to those skilled in the art.

Figure 3:
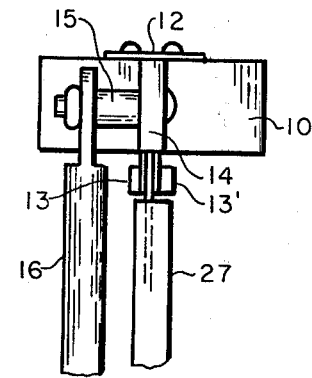
FIG. 3 is a partial rear elevation of FIG. 2.

The tool, as can be seen in FIG. 2 and FIG. 3, is attached to the upper card guide 26 by attaching magnets 11 to the front face of the card guide with card 28 sandwiched between spring clips 13 and 13'. Retainer clip 12 hooks over member 25 of card guide 26. With upper body 10 in position handle 16 is free to pivot about pin 15 and likewise linkage 18 allowed to pivot about pin 17. Linkage 18 is then interlockingly engaged to the card stiffener via the notch 19 engaging a similar notch in the stiffener or handle. Once engaged card 28 is extracted by grasping handle 16 and pulling in the direction required to extract the card from the holder and consequently the connectors. A formed wire 20 supports and keeps linkage 18 in a horizontal position when not engaged to the circuit card.

The present invention has been described with reference to a specific embodiment thereof, for the purpose of illustrating the manner in which the invention may be used to advantage and will be appreciated by those skilled in the art that the invention is not limited thereto. Accordingly, any and all modifications, variations or equivalent arrangements which may occur to those skilled in the art should be considered to be within the scope of the invention.

What is claimed is:

1. A tool for facilitating the extraction of a printed circuit card from a holder, the latter having top and bottom parallel card guides each card guide including at least one transversely oriented guide track having respective lateral card edges resting therein, said circuit card including a handle mounted to a transverse edge of said circuit card, said tool comprising:

a mounting body including at least one magnet and a retainer clip, said magnet and retainer clip extending outward from a front face of said mounting body arranged to engage and attach said mounting body to said top card guide;

a pair of L-shaped spring guides arranged parallel to each other extending outward from said mounting body parallel to said magnet, said spring guides arranged to receive said circuit card therebetween when said mounting body is installed on said card guide;

a handle rotatably mounted to said mounting body; and a linkage rotatably mounted to said handle opposite said mounting body said linkage including means for interlockingly engaging said circuit card handle;

whereby a pulling force applied to said handle extracts said circuit card from said holder.

2. A tool for facilitating the extraction of a printed circuit card as claimed in claim 1, wherein: said handle includes a bore on one end and said mounting body includes a flange vertically oriented and extending outward from a rear face of said body said flange including a centrally located shaft extending perpendicularly from said flange and arranged to receive said handle bore allowing said handle to be rotatably mounted thereat.

3. A tool for facilitating the extraction of a printed circuit card as claimed in claim 2, wherein: an opposite end of said handle includes a bore, and said linkage includes a bore on a first end and a pin extends through said linkage bore and said handle bore pivotally mounting said linkage thereat.

4. A tool for facilitating the extraction of a printed circuit card as claimed in claim 3, wherein: said linkage includes a second end and said second end includes a notched portion arranged to be received by said card handle interlockingly engaging said linkage thereat.

* * * * *